United States Patent
Gilbert

(10) Patent No.: US 11,915,916 B2
(45) Date of Patent: Feb. 27, 2024

(54) MULTIPACTOR PLASMA IGNITION DEVICES AND TECHNIQUES

(71) Applicant: Eric Benjamin Frederick Gilbert, Seattle, WA (US)

(72) Inventor: Eric Benjamin Frederick Gilbert, Seattle, WA (US)

(*) Notice: Subject to any disclaimer, the term of this patent is extended or adjusted under 35 U.S.C. 154(b) by 244 days.

(21) Appl. No.: 17/192,781

(22) Filed: Mar. 4, 2021

(65) Prior Publication Data
US 2021/0280402 A1 Sep. 9, 2021

Related U.S. Application Data

(60) Provisional application No. 62/985,195, filed on Mar. 4, 2020.

(51) Int. Cl.
*H01J 37/32* (2006.01)
*H01J 37/34* (2006.01)
*H05H 1/24* (2006.01)

(52) U.S. Cl.
CPC .... *H01J 37/3405* (2013.01); *H01J 37/32669* (2013.01); *H01J 2237/152* (2013.01)

(58) Field of Classification Search
CPC .. H01J 37/32; H01J 37/32009; H01J 37/3222; H01J 37/32201; H01J 37/32229; H01J 37/3405; H01J 37/3244; H01J 37/32577; H01J 2237/00; H01J 25/76; H01J 2225/78; H05H 1/24; H05H 1/4622; H05H 1/463; G21B 1/00; G21B 1/05; G21B 1/11; Y02E 30/10
See application file for complete search history.

(56) References Cited

U.S. PATENT DOCUMENTS

| | | | | |
|---|---|---|---|---|
| 4,169,987 A | | 10/1979 | Oguro et al. | |
| 4,672,340 A | * | 6/1987 | Esterson | H01J 23/207 315/39.77 |
| 6,087,614 A | | 7/2000 | Ishizuka et al. | |
| 2002/0127155 A1 | * | 9/2002 | Minaee | B01D 53/007 422/186 |
| 2007/0045244 A1 | * | 3/2007 | Lee | H01J 37/32229 219/121.43 |
| 2010/0156295 A1 | * | 6/2010 | Park | H01J 61/54 313/643 |
| 2012/0161629 A1 | * | 6/2012 | Kim | H05B 41/2806 315/39 |
| 2013/0089171 A1 | * | 4/2013 | Sykes | H05H 3/06 376/133 |

OTHER PUBLICATIONS

Mishra et al., "Conditioning technique for high power RF vacuum transmission line components using multipactor plasma." Journal of Physics: Conference Series. Vol. 208. No. 1. IOP Publishing, 2010 (2010), entire document [online] <https:l/iopsr:ii:mcl'!.iop.org/article/10.1088/174::>-6596/208/1/012017 /meta>.
PCT Search Report and Written Opinion dated Aug. 10, 2021, 9 pages.

* cited by examiner

*Primary Examiner* — Thai Pham
(74) *Attorney, Agent, or Firm* — Lee & Hayes P.C.

(57) ABSTRACT

A high temperature plasma generating system has a magnetron joined to a frustoconical waveguide reflector. An antenna is set on a cavity magnetron tube and extends the length of the antenna. Applying electrical power to the magnetron creates multipactor in the frustoconical waveguide reflector, generating plasma focused at the tip of the extended magnetron antenna.

20 Claims, 5 Drawing Sheets

MULTIPACTOR PLASMA IGNITION DEVICES AND TECHNIQUES

RELATED APPLICATIONS

This application claims priority to U.S. Provisional Patent Application 62/985,195, filed Mar. 4, 2020, which is incorporated herein by reference.

BACKGROUND

The embodiments herein relate generally to microwave systems. Prior to examples of the disclosure, plasma was typically generated by high voltage power supply such as in welding and plasma furnaces. These plasma arcs were hot but require two electrodes to complete the circuit and require large power supplies. Examples of the disclosure solve this problem.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

DETAILED DESCRIPTION

Cavity magnetrons are an efficient means of generating high amplitude electromagnetic radiation of a bounded frequency. Furthermore, waveguides are utilized for transmission of RF energy with low losses. Multipactor is usually considered a phenomenon of plasma arcing inside waveguides and in signal transmission is considered to be a negative outcome of suboptimal waveguide design. However, RF generation of plasma has practical use in industry and this invention seeks to optimize the multipactor effect and utilize the generation of high intensity plasma for practical purpose. Air at sea level can be ignited into plasma if enough activation energy is provided such that the spark gap voltage is exceeded. Resulting from the energized atmospheric plasma are Nitrous Oxide compounds and ozone.

This application relates to structures and techniques for generating plasma. In some examples a magnetron is coupled to an antenna disposed in region of influence of a waveguide. In some examples, the magnetron is energized creating oscillating electromagnetic fields that are transmitted through the antenna. In examples, the electromagnetic fields generate a multipactor effect at an end of the antenna. In examples, the multipactor effect concentrates energy sufficient to create a plasma. In examples, the antenna is disposed in selected environments, including, but not limited to, a vacuum, a partial vacuum, atmosphere, a gas, such as a noble gas or steam and methane for methane reforming of hydrogen, or combinations thereof.

Illustrative Multipactor Plasma Ignition

In examples of the present disclosure, a technique by which a magnetron antenna configuration capable of igniting sea level atmospheric air into plasma without any separate ignition source at a power level of 1 kW. The magnetron antenna is extended by ½λ (wavelength) to a combined total of ¾λ. Additionally, a waveguide of specific dimension and configuration is utilized to generate the multipactor. In examples, the orientation and dimension of the waveguide may be used to optimize the generation of a sufficient high voltage multipactor effect at the tip of the waveguide antenna. In examples, when a tungsten electrode is used, the heat generated in the tungsten produces very high intensity light in addition to the plasma ignition.

A further illustrative example provides a functional use of the compact and efficient plasma generator to create a flow of steam plasma for pyrolysis reactions such as the creation of syngas from organic materials.

Another illustrative example provides a functional use of the high power, high voltage focused plasma generation in a vacuum chamber to energize and accelerate hydrogen isotope ions to overcome the coulombic charge barrier and enable nuclear fusion. This is a novel mechanism compared to that of a fusor which uses high voltage DC to accelerate and collide hydrogen isotope ions causing nuclear fusion at a small scale.

Figure 1:
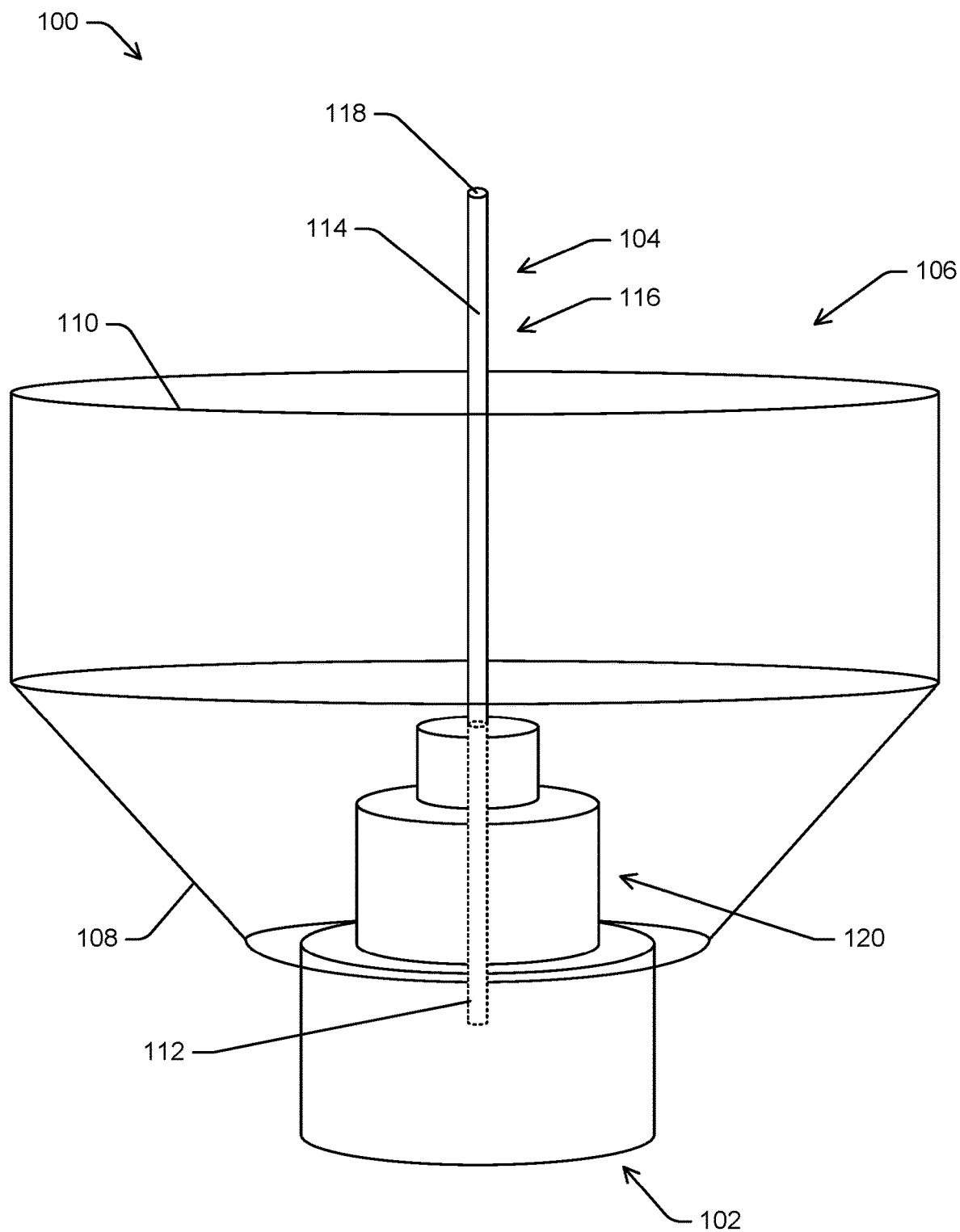
FIG. 1 is an illustration of a side view of a tuned waveguide antenna for multipactor plasma generation in accordance with an illustrative example.

Illustrative Multipactor Plasma Ignitor and Illustrative Waveguide Multipactor Antenna FIG. 1 shows an isometric schematic depiction of an illustrative waveguide multipactor antenna system (WMA system 100). For example, FIG. 1 shows the WMA system 100 including a magnetron 102, for example, a cavity magnetron, coupled to an antenna 104, for example, a tuned antenna. In examples, the WMA system 100 may have a waveguide 106, that may direct waves emanating from the antenna 104. In examples, the waveguide 106 may comprise multiple sub waveguide components. For example, FIG. 1 shows the waveguide 106 comprising a frustoconical waveguide portion 108 coupled to a cylindrical waveguide portion 110. In examples, the waveguide 106 may include a singular geometry or multiple geometric shapes. In examples, the waveguide 106 comprises a planar shaped portion, an angled portion, a frusto-spherical portion, among others or combinations thereof.

In examples, the antenna 104 may comprise a singular portion or multiple portions. For example, a magnetron may include a first portion 112 having a first length, and a second portion 114 having a second length that may be coupled to the first portion 112 having the first length to create an effective antenna 116 having a third length. In examples, the first portion 112 having the first length may be approximately a ¼ of a characteristic wavelength generated by the magnetron, the second portion 114 having the second length may be approximately ½ of the characteristic wavelength, and the third length of the effective antenna 116 may be approximately ¾ of the characteristic wavelength.

In examples, the antenna 104 may have a tuned length. In examples, the tuned length of the antenna 104 is approximately ¾ of a characteristic wavelength of the magnetron. In examples, an effective length of the antenna 104, for example, the tuned length and/or the third length of the effective antenna, of approximately ¾ of a characteristic wavelength, when powered by the magnetron, may generate a multipactor effect on the antenna.

In examples, the effective length of the antenna 104 of approximately ¾ of a characteristic wavelength coupled with the waveguide 106, when powered by the magnetron, may generate a multipactor effect at a location along the antenna 104. In examples, the location along the antenna 104 may be controlled by one or more of the antenna length, the configuration of the waveguide, or the characteristic wavelength generated by the magnetron. In examples, the location of the multipactor effect may be located at an end of the antenna 104, for example, at location 118.

In examples, the antenna 104 may include various conductive materials in various configurations. For example, antenna 104 may comprise a metallic conductive tube, a solid core, or a combination thereof.

FIG. 1 also shows WMA system 100 including a conductive support 120 for antenna 104. In examples, the conductive support 120 may provide a physical support the antenna 104 as well as be electrically coupled to the antenna 104. In examples, the conductive support 120 may also be electrically coupled to the waveguide 106. In examples, the conductive support 120 electrically couples the antenna 104 to the waveguide 106.

In examples, the waveguide 106 may extend in a direction from the magnetron 102 to surround a portion of the antenna 104. In examples, the waveguide 106 extends to surround a portion of the antenna 104 associated with ½ of the characteristic wavelength. In examples, by surrounding the antenna 104 at the ½ wavelength, emissions from this portion of the antenna 104 may be captured, reflected, deflected, diffused, or directed towards a location or region on the antenna 104 or to a location or region of the waveguide 106.

Illustrative Plasma Generation System

Figure 2:
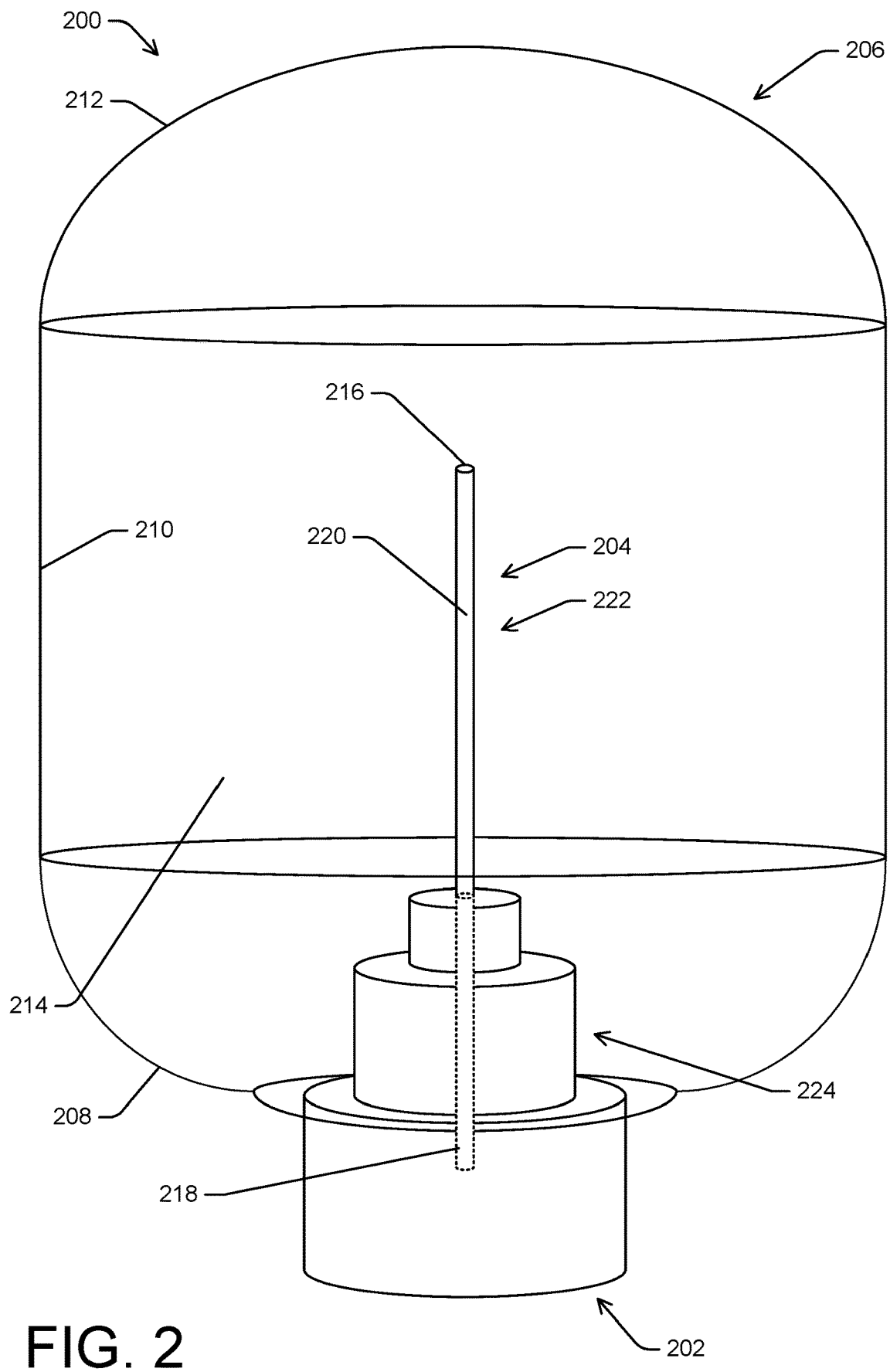
FIG. 2 is an illustration of a high intensity light source using multipactor to heat a tungsten rod in a noble gas in accordance with an illustrative example.

FIG. 2 shows an isometric schematic depiction of an illustrative plasma generation system 200. For example, FIG. 2 shows the system 200 including a magnetron 202, for example, a cavity magnetron, coupled to an antenna 204, for example, a tuned antenna. In examples, the plasma generation system 200 may have a waveguide 206, that may direct waves emanating from the antenna 204.

In examples, the waveguide 206 may comprise multiple sub waveguide components. For example, FIG. 2 shows the waveguide 206 comprising a frusto-spherical waveguide portion 208 coupled to a cylindrical waveguide portion 210 coupled to a cap waveguide portion 212.

In examples, the plasma generation system 200 when powered may generate a high intensity light source. In examples, the plasma generation system 200 may use the multipactor effect to heat the antenna 204, for example, comprising a tungsten rod, in a controlled environment 214, for example, a noble gas. In this example, a high intensity light radiates from the heated tungsten at the unsupported end of the antenna 204, for example, near location 216, at for example, an end of the antenna and/or rod.

In examples, the cap waveguide portion 212 may comprise a frusto-spherical configuration. In examples, the waveguide 206 may include a singular geometry or multiple geometric shapes. In examples, the waveguide 206 comprises a planar shaped portion, an angled portion, a frusto-conical portion, parabolic, among others or combinations thereof. In examples, the waveguide 206 may have reflective surfaces. For example, 208 and 212 may have a surface facing the antenna 204 that is optically polished. In examples, the cylindrical waveguide portion 210 may comprise a transparent or semi-transparent material, for example, glass, composite, or other material. In examples, the cylindrical waveguide portion 210 may comprise a portion of a faraday cage. For example, a wire mesh, for example, copper, may be outside, inside, and/or embedded within the transparent or semi-transparent material. In examples, the cylindrical waveguide portion 210 when coupled to the 208 and 212 may form a faraday cage suitable to prevent leakage of emissions from the antenna 204 and allow for the emission of visible light.

In examples, the cylindrical waveguide portion 210 when coupled to the 208 and 212 may form a hermetic enclosure sufficient to keep a controlled environment within the waveguide 206. In example, the hermetic enclosure may include a noble gas, for example, xenon, helium, argon, among others, that may prevent or reduce the oxidation of materials within the enclosure. In examples, a pressure of the hermetic enclosure may be at a lower pressure than atmosphere when the system is cool and unpowered such that, when the system is at a first power level, the contained gases heat up and increase the pressure within the enclosure to a pressure at or below atmospheric pressure. In these examples, the lower pressure may allow a construction technique of hermetic enclosure to simpler and more reliable than one configured to operate a pressure above atmospheric pressure. In examples, this configuration may also require less noble gas to be used to fill the enclosure.

In examples, the antenna 204 may comprise a singular portion or multiple portions. For example, a magnetron may include a first portion 218 having a first length, and a second portion 220 having a second length that may be coupled to the first portion 218 having the first length to create an effective antenna 222 having a third length. In examples, the first portion 218 having the first length may be approximately a ¼ of a characteristic wavelength generated by the magnetron, the second portion 220 having the second length may be approximately ½ of the characteristic wavelength, and the third length of the effective antenna 222 may be approximately ¾ of the characteristic wavelength.

In examples, the antenna 204 may have a tuned length. In examples, the tuned length of the antenna 204 is approximately ¾ of a characteristic wavelength of the magnetron. In examples, an effective length of the antenna 204, for example, the tuned length and/or the third length of the effective antenna, of approximately ¾ of a characteristic wavelength, when powered by the magnetron, may generate a multipactor effect on the antenna.

In examples, the effective length of the antenna 204 of approximately ¾ of a characteristic wavelength coupled with the waveguide 206, when powered by the magnetron, may generate a multipactor effect at a location along the antenna 204. In examples, the location along the antenna 204 may be controlled by one or more of the antenna length, the configuration of the waveguide, or the characteristic wavelength generated by the magnetron. In examples, the location of the multipactor effect may be located at an end of the antenna 204, for example, at location 216.

In examples, the antenna 204 may include various conductive materials in various configurations. For example, antenna 204 may comprise a metallic conductive tube, a solid core, or a combination thereof.

FIG. 2 also shows plasma generation system 200 including a conductive support 224 for antenna 204. In examples, the conductive support 224 may provide a physical support the antenna 204 as well as be electrically coupled to the antenna 204. In examples, the conductive support 224 may also be electrically coupled to the waveguide 206. In examples, the conductive support 224 electrically couples the antenna 204 to the waveguide 206.

Illustrative Smelter Device

Figure 3:
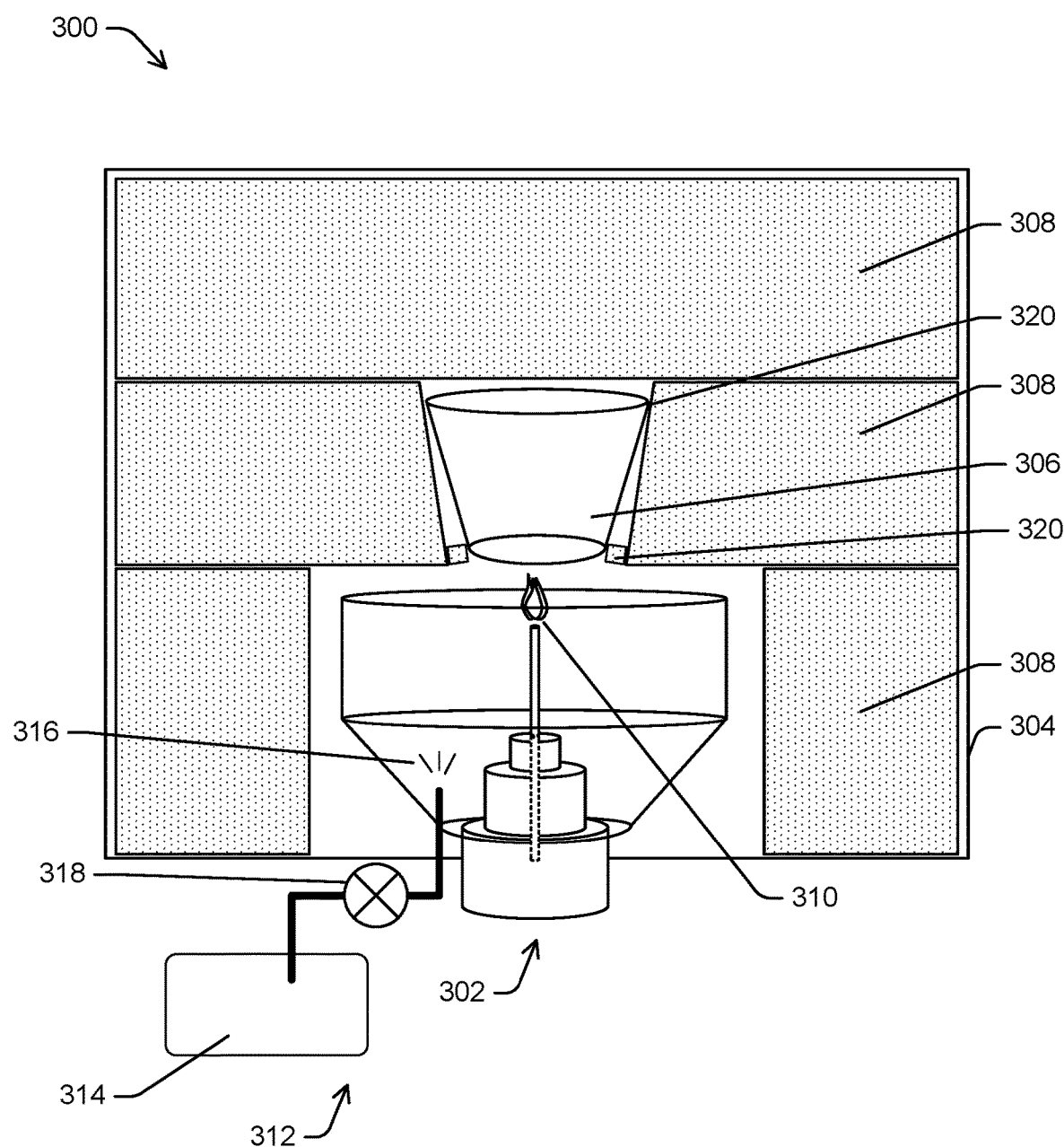
FIG. 3 is an illustration of a tuned waveguide antenna for multipactor plasma generation for small scale industrial smelting in accordance with an illustrative example.

FIG. 3 shows an illustrative smelter system 300. In examples, smelter system 300 includes a waveguide multipactor antenna system (WMA system 302), for example, similar to the waveguide multipactor antenna system discussed with respect to FIG. 1, and may have similar capabilities and configurations, for example, the WMA system 302 may generate a plasma at a location or region on its antenna. In examples, smelter system 300 includes the WMA system 302 partially contained within a controlled environment 304 and configured to heat a crucible 306. In examples, the smelter system 300 may include a thermal insulation system 308, for example, refractory blocks.

In examples, the smelter system 300 generates a continuous air and steam plasma flare 310 heat the crucible 306. In examples, the continuous air and steam plasma flare heats the crucible quicker and more efficiently and conventional systems. In examples, the flare 310 is further driven by an injection system 312. In examples, the injection system 312 includes a water and gas generator source 314 that provides a mist spray 316 into the controlled environment 304, for example, near the antenna. In examples, the mist spray 316 injects small amounts of water into the system enabling the generation of steam plasma. In examples, the injection system 312 includes a valve 318 configured to control the injection of the mist spray 316.

In examples, the mist spray 316 generates steam and interacts with hydrocarbons present in the smelter system. In examples, the steam and hydrocarbons are reformed into hydrogen and carbon monoxide. In examples, the reformation generates syngas that may be captured or used in the system.

In examples, the smelter system 300 may have a seal component 320 or feature that may prevent or reduce transmission or circulation of gasses between the WMA system 302 and an opening in the crucible 306. In examples, the seal component 320 may be disposed below or adjacent to an end of the crucible 306 near the WMA system 302. In examples, the seal component 320 may be located at a surface or region of the crucible 306 further away from the WMA system 302. In examples, the seal component 320 may be formed by an interference fit between a surface of the crucible 306 and a portion of the thermal insulation system 308, for example, an edge or surface of a refractory block. In examples, this encourages recirculation of the heated gases below the crucible 306 to increase efficiency of the system.

Illustrative Multipactor Fusor Device

Figure 4:
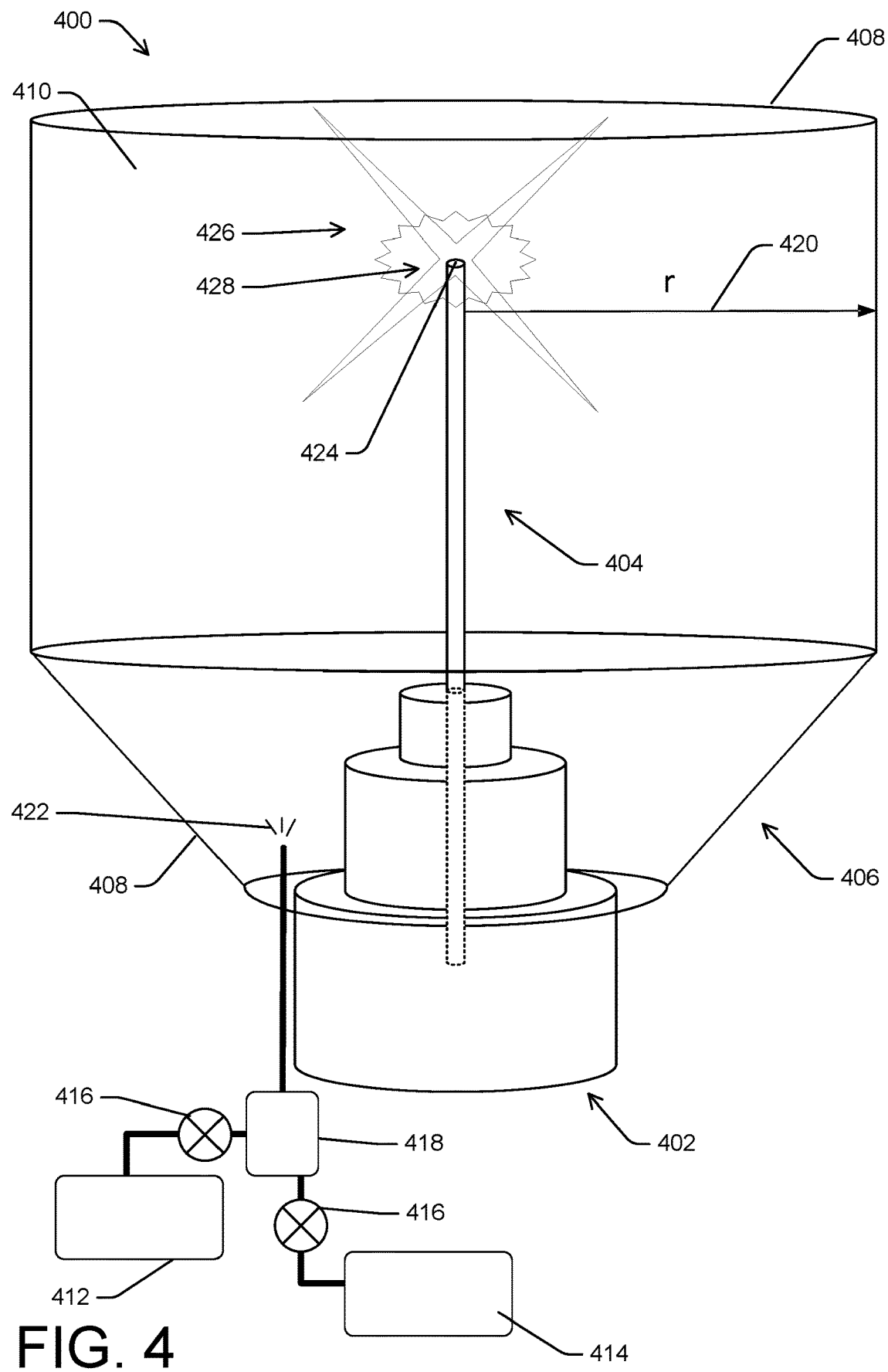
FIG. 4 is an illustration of a multipactor fusor device in accordance with an illustrative example.

FIG. 4 shows an illustrative multipactor fusor device (MFD 400). In examples, the MFD 400 includes a waveguide multipactor antenna system (WMA system 402), for example, similar to the waveguide multipactor antenna system discussed with respect to FIG. 1, and may have similar capabilities and configurations, for example, the WMA system 402 may generate a plasma at a location or region on its antenna 404. In examples, the MFD 400 includes a waveguide 406 configured to direct, reflect, and/or attenuate emissions from the antenna 404. In examples, the waveguide 406 may comprise multiple shapes, pieces, and/or configurations, for example, similar to those discussed with respect to FIGS. 1-3.

In examples, the MFD 400 includes an environmental containment system 408. In examples, the environmental containment system 408 is configured to hold a vacuum and/or isolate gases inside the environmental containment system 408 from outside of the environmental containment system 408. In examples, the environmental containment system 408 comprises a bell jar. In examples, the environmental containment system 408 and the waveguide 406 define a chamber 410.

In examples, the MFD 400 includes a vacuum pump 412 coupled to and in liquid communication with the environmental containment system 408. In examples, the vacuum pump 412 is configured to evacuate gasses from the environmental containment system 408. In examples, the vacuum pump 412 is configured to maintain a vacuum and/or near vacuum in the environmental containment system 408.

In examples, the MFD 400 includes a gas supply 414. In examples, the gas supply 414 is configured to supply hydrogen isotopes to the MFD 400. For example, the gas supply 414 may be configured to provide a minute amount of tritium and/or deuterium gas into the environmental containment system 408 such that a near vacuum is maintained with the minute amount of tritium and/or deuterium gas present inside the chamber 410. In examples, the connections between the vacuum pump 412 and/or the gas supply 414 with the environmental containment system 408 may is controlled by valves 416. In examples, the vacuum pump 412 and the gas supply 414 couple to each other via a connection 418 outside of the environmental containment system 408 before entering the environmental containment system 408. In examples, the vacuum pump 412 and the gas supply 414 the enter the environmental containment system 408 separately from each other.

In examples, the waveguide 406 conforms to a shape of the environmental containment system 408. In examples, surfaces of the waveguide 406 and/or the containment system 408 act as a neutron reflector. In examples, the environmental containment system 408 and/or the waveguide 406 comprises a conductive, neutron reflecting material.

In examples, the chamber has a radius 420. In examples, the radius 420 is equal to or greater than ½ of the characteristic wavelength of the WMA system 402. In examples, the radius of equal to or greater than ½ of the characteristic wavelength causes the cutoff frequency to remain above the magnetron emission.

In examples, the MFD 400 may be used in a nuclear fusion application. For example, the MFD 400 may generate an electric field proximate to a location on the antenna 404. In examples, the electric field may cause a potential between across the chamber 410. In examples, fuel 422, for example the hydrogen isotopes, are delivered into the chamber 410 and is accelerated towards an end 424 of the antenna 404. In examples, the magnetron of the WMA system 402 generates resonating emission from the antenna 404. In examples, the resonating emissions generate an electric field at the end 424 of the antenna 404 to accelerate hydrogen isotope ions to extremely high velocity. In examples, the acceleration is similar to a fusor device of traditional construction using a direct current source. The generation of the electric field with the resonating emissions allows a lower power to be required when compared to a similar direct current source.

In examples, a neutron rich emission 426 is generated from the MFD 400 at the end 424 of the antenna 404. In examples the neutron rich emission 426 is detected to determine that atomic fusion has occurred. Given the high energy state of the neutron rich emission 426, shielding should be used for safety.

In examples, a region of antenna 404, for example, at the end 424, includes a lithium coating 428. In examples, the lithium coating 428 enables a breeding of tritium so as to enable a sustained Deuterium-Tritium (D-T) fusion reaction. A highly localized nature of the multipactor accelerator enables trace amounts of lithium to undergo nuclear breeder reaction releasing trace amounts of tritium at the center of the chamber to collide with the accelerated deuterium ions.

In examples, a region of antenna 404, for example, at the end 424, includes a boron coating 428. In examples, when the trace gas introduced into the chamber is hydrogen, the boron coating enables a boron to proton fusion reaction at the center of the chamber which may not emit neutrons.

Illustrative Plasma Generation Devices and Techniques

In examples, a high temperature smelting system, is configured to create/generate plasma. The high temperature smelting system has a ceramic magnetron insulator joined to a frustoconical waveguide reflector. A cavity magnetron tube is joined to the frustoconical waveguide reflector. An antenna is set in the cavity magnetron tube and extending through the ceramic magnetron insulator. Applying an electrical current to the cavity magnetron creates multipactor in the frustoconical waveguide reflector generating plasma within the frustoconical waveguide reflector and creating a high temperature for the high temperature smelting system.

In examples, a waveguide choke antenna having ¼ wavelength is coupled to an antenna rod extender to ¾ wavelength. In examples, the antenna is sharpened to a point.

In some examples, a cavity magnetron commercially available may be used in conjunction with a waveguide. In examples, microwave ovens already tune the antenna at ¼ wavelength to be capacitive so as to optimize the electric field oscillations. This is how the food is cooked. By taking those same oscillations and using a waveguide to focus the multipactor effect between the waveguide and the end of the antenna, a tightly focused pulsation of electrons collapses and radiates between the antenna and the waveguide. This is called multipactor. The specific nature of this device is to intentionally optimize the construction to maximize this effect for use as a plasma generation device. The heat and light from the plasma and electrode has many practical uses in industry including a light source and plasma reforming and pyrolysis. As a fusor, the electric field oscillation is matched in opposite charge by a deuterium ion oscillation enabling+ion acceleration in the very high voltage field induced by the multipactor.

Different examples contemplate that there are a number of ways the systems may be constructed. In examples, dimensional forms as described in relation to the wavelength of the magnetron emission may be used to scale the devices. In some examples, a magnetron from a commercial device is modified by removing the choke cover and attaching, with copper tape, the electrode to the specific length to make the antenna ¾ wavelength. In examples, and as confirmed in experiments, a ¼ wavelength antenna work as well as long as the antenna comes to a sharp point.

Persons of ordinary skill in the art may appreciate that numerous design configurations may be possible to enjoy the functional benefits of the inventive systems. Thus, given the wide variety of configurations and arrangements of embodiments of the present invention the scope of the invention is reflected by the breadth of the claims below rather than narrowed by the embodiments described above.

Illustrative Techniques

Figure 5:
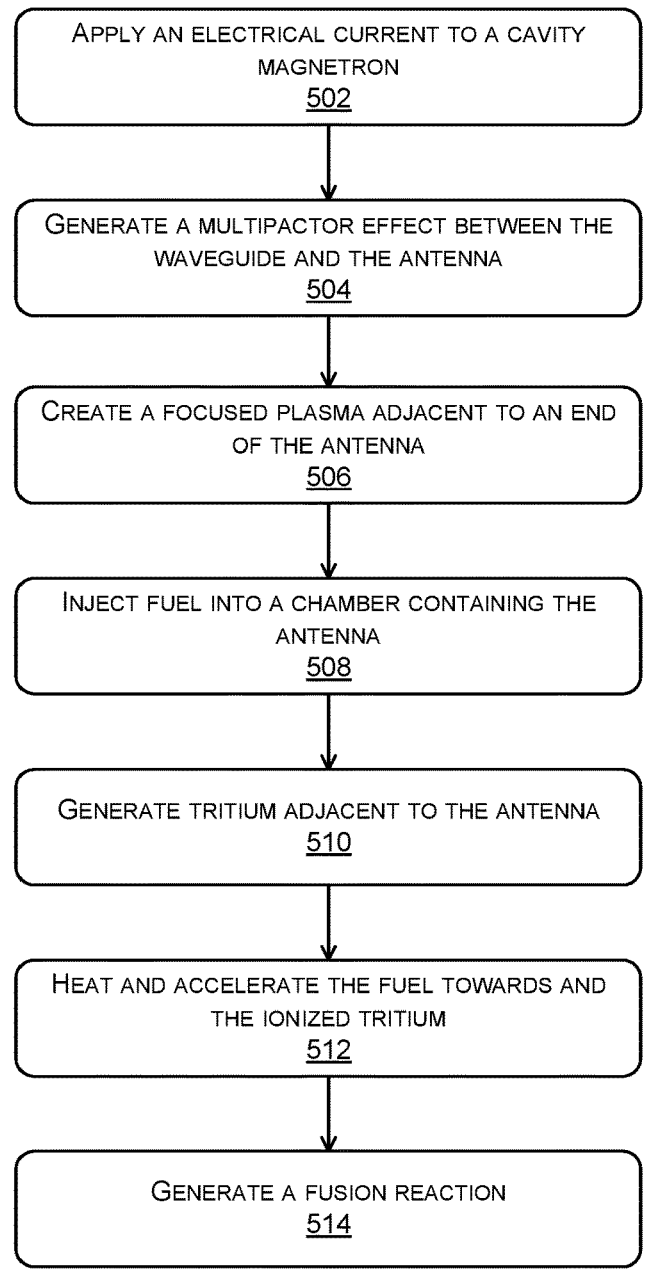
FIG. 5 is a flow chart showing an illustrative example method and process involving plasma generation with a tuned waveguide antenna in accordance with an illustrative example.

FIG. 5 is a flow chart showing an illustrative example method and process involving plasma generation. For example, FIG. 5 shows an example, process 500 of generating a fusion reaction. At operation 502, an electrical current is applied to a cavity magnetron. In examples, the cavity magnetron is coupled to an antenna and set adjacent to a waveguide.

At operation 504, a multipactor effect is generated by interactions between emissions from the antenna and the waveguide.

At operation 506, a focused plasma is created adjacent to an end of the antenna. In examples, the end of the antenna is an end distal from the cavity magnetron.

At operation 508, fuel is injected into a chamber containing the antenna and the focused plasma. In examples, the chamber is kept at a near vacuum.

At operation 510, tritium is generated adjacent to the antenna. In examples, the tritium is generated by an interaction between the plasma generated at the antenna and a material at the end of the antenna. In examples, the material is coated on a surface of the antenna. In examples, the material is embedded into the antenna. In examples, the antenna comprises the material. In examples, the material includes Boron, Lithium, or combinations thereof. In examples, the tritium is created by a breeding reaction between the material and the focused plasma.

At operation 512, fuel is accelerated towards in the chamber. In examples, fuel is injected at one end of the chamber, for example, an end proximate to the cavity magnetron and/or entry of the antenna into the chamber. In examples, the focused plasma creates an electrical field having an electrical potential. The electrical field applies a force on the fuel accelerating the fuel in the direction of the force driven by the electrical potential. In examples, the electric field accelerates the towards the end of the antenna that is distal from the cavity magnetron and/or where the antenna enters the chamber. In examples, the electrical field is sufficiently strong to accelerate the fuel to a focal point where the plasma temperature is the highest. In examples, the fuel comprises deuterium ions, and protons.

At operation 514, a fusion reaction is generated. In examples, the fusion reaction is generated by the impact between the accelerated fuel and the tritium plasma. The energy and temperature of the plasma is high enough to overcome coulombic forces and enables nuclear fusion reactions such as Deuterium-Deuterium, Deuterium-Tritium, and Boron-Protium.

EXAMPLE CLAUSES

Any of the example clauses in this section may be used with any other of the example clauses and/or any of the other examples or embodiments described herein.

A: A system configured to create generate plasma; the system comprising: a ceramic magnetron insulator, joined to a frustoconical waveguide reflector; a cavity magnetron tube, joined to the frustoconical waveguide reflector; and an antenna, set in the cavity magnetron tube and extending through the ceramic magnetron insulator; wherein applying an electrical current to the cavity magnetron creates multipactor in the frustoconical waveguide reflector generating plasma within the frustoconical waveguide reflector and creating a focused plasma.

B: The system of paragraph A, wherein the focused plasma is created adjacent to a first end of the antenna, the first end of the antenna distal from the magnetron.

C: The system of paragraph A or B, wherein the antenna has a length of approximately ¾ of a characteristic wavelength of the cavity magnetron.

D: The system of anyone of paragraphs A-C, wherein the antenna has a length of approximately ¼ of a characteristic wavelength of the cavity magnetron.

E: The system of anyone of paragraphs A-D, wherein the antenna has a first end distal to the cavity magnetron, the first end creating a point.

F: The system of anyone of paragraphs A-E, further comprising a cylindrical waveguide coupled to the frustoconical waveguide surrounding a portion of the antenna.

G: The system of anyone of paragraphs A-F, wherein the cylindrical waveguide surrounds a portion of the antenna corresponding to a location that is distance from the cavity magnetron of approximately ½ of a characteristic wavelength of the cavity magnetron.

H: The system of anyone of paragraphs A-G, further comprising a frusto-spherical waveguide coupled to the cylindrical waveguide enclosing an end of the antenna.

I: The system of anyone of paragraphs A-H, further comprising a frusto-spherical waveguide coupled to the cylindrical waveguide enclosing an end of the antenna.

J: The system of anyone of paragraphs A-I, further comprising a hermetic, optically transparent enclosure enclosing the antenna and the frustoconical waveguide and an inert gas.

K: The system of anyone of paragraphs A-J, wherein the hermetic, optically transparent enclosure is held at a first pressure below atmospheric pressure when cool and held at a second pressure greater than the first pressure and equal to or below atmospheric pressure when a plasma is generated.

L: The system of anyone of paragraphs A-K, further comprising an injection system configured to inject a fluid adjacent to the antenna.

M: The system of anyone of paragraphs A-L, wherein the fluid comprises water that is transformed into steam and reacts with hydrocarbons to generate hydrogen and carbon monoxide.

N: A method comprising: applying an electrical current to a cavity magnetron coupled to an antenna, the antenna extending through a waveguide, the antenna having a length of approximately ¾ of a characteristic wavelength of the cavity magnetron; generating a multipactor effect between the waveguide and the antenna; and creating a focused plasma adjacent to an end of the antenna.

O: The method of paragraph N, further comprising: injecting a fuel into a controlled environment containing the antenna and waveguide; generating tritium plasma adjacent to end of the antenna; accelerating the fuel and the tritium plasma; colliding the fuel with the tritium; and generating a fusion reaction.

P: The method of paragraph N or O, wherein the fuel comprises deuterium ions and protons.

Q: The method of anyone of paragraphs N-P, wherein the controlled environment is controlled to be at a near vacuum.

Q: A fusor system comprising: a cavity magnetron having a characteristic wavelength of emission; an antenna coupled to the cavity magnetron, the antenna having a length, the length approximately ¾ of the characteristic wavelength; a waveguide disposed adjacent to the antenna and configured to reflect emissions from the antenna to generate a multipactor effect; an enclosure enclosing the antenna and the waveguide creating a chamber, the enclosure configured to control an environment within the enclosure; and a fuel injection system configured to inject a fuel into the chamber and generate a fusion reaction in response to the multipactor effect of emission generated by the cavity magnetron.

R: The fusor system of paragraph Q, wherein the fuel comprises a deuterium ions and protons.

S: The fusor system of paragraphs Q or R, wherein the waveguide and a portion of the enclosure is configured to reflect neutrons.

While the example clauses described above are described with respect to one particular implementation, it should be understood that, in the context of this document, the content of the example clauses may also be implemented via a method, device, system, a computer-readable medium, and/or another implementation.

CONCLUSION

While one or more examples of the techniques described herein have been described, various alterations, additions, permutations and equivalents thereof are included within the scope of the techniques described herein.

In the description of examples, reference is made to the accompanying drawings that form a part hereof, which show by way of illustration specific examples of the claimed subject matter. It is to be understood that other examples can be used and that changes or alterations, such as structural changes, can be made. Such examples, changes or alterations are not necessarily departures from the scope with respect to the intended claimed subject matter. While the steps herein may be presented in a certain order, in some cases the ordering may be changed so that certain inputs are provided at different times or in a different order without changing the function of the systems and methods described. The disclosed procedures could also be executed in different orders. Additionally, various computations that are herein need not be performed in the order disclosed, and other examples using alternative orderings of the computations could be readily implemented. In addition to being reordered, the computations could also be decomposed into sub-computations with the same results.

What is claimed is:

1. A system configured to generate plasma comprising:
a frustoconical waveguide reflector;
a conductive support at least partially disposed within the frustoconical waveguide reflector;
a magnetron coupled to the frustoconical waveguide reflector; and
an antenna including:
a first portion at least partially disposed within in the magnetron and the conductive support, and
a second portion having a first end coupled to the first portion and disposed external to the magnetron and the conductive support;
wherein applying an electrical current, via a power supply, to the magnetron creates a multipactor effect at a second end of the second portion for generating plasma, the second end being opposite the first end.

2. The system of claim 1, wherein the plasma is generated adjacent to the second end of the antenna.

3. The system of claim 1, wherein the antenna has a length of approximately ¾ of a characteristic wavelength of the magnetron.

4. The system of claim 1, wherein the antenna has a length of approximately ¼ of a characteristic wavelength of the cavity magnetron.

5. The system of claim 1, further comprising a cylindrical waveguide reflector coupled to the frustoconical waveguide reflector, wherein the cylindrical waveguide reflector is disposed at least partially around the second portion of the antenna.

6. The system of claim 5, wherein the cylindrical waveguide reflector surrounds the second portion of the antenna corresponding to a location that is distant from the magnetron of approximately ½ of a characteristic wavelength of the magnetron.

7. The system of claim 5, further comprising a frusto-spherical waveguide reflector coupled to the cylindrical waveguide reflector, the frusto-spherical waveguide reflector enclosing the second end of the antenna.

8. The system of claim 1, further comprising a hermetic, optically transparent enclosure enclosing the antenna and the frustoconical waveguide reflector and an inert gas.

9. The system of claim 8, wherein the hermetic, optically transparent enclosure is held at a first pressure below atmospheric pressure when cool and held at a second pressure greater than the first pressure and equal to or below atmospheric pressure when the plasma is generated.

10. The system of claim 1, further comprising an injection system configured to inject a fluid adjacent to the antenna.

11. The system of claim 10, wherein the fluid comprises water that is transformed into steam and reacts with hydrocarbons to generate hydrogen and carbon monoxide.

12. The system of claim 1, wherein the conductive support electrically couples the antenna to the frustoconical waveguide reflector.

13. A method for generating plasma comprising:
applying, via a power supply, an electrical current to a cavity magnetron coupled to an antenna, the antenna being at least partially disposed within a waveguide and having a length of approximately ¾ of a characteristic wavelength of the cavity magnetron;
generating, based at least in part on applying the electrical current to the cavity magnetron, a multipactor effect at least partially within the waveguide; and
generating, via the cavity magnetron, plasma adjacent to an end of the antenna.

14. The method of claim 13, further comprising:
injecting a fuel into a controlled environment containing the antenna;
generating tritium plasma adjacent to the end of the antenna;
accelerating the fuel and the tritium plasma;
colliding the fuel with the tritium plasma; and
generating a fusion reaction.

15. The method of claim 14, wherein the fuel comprises deuterium ions and protons.

16. The method of claim 14, wherein the controlled environment is at a near vacuum.

17. The method of claim 13, wherein:
the antenna includes:
 a first portion disposed at least partially within the cavity magnetron, and
 a second portion coupled to the first portion;
the first portion forms a first part of the length that is approximately ¼ of the characteristic wavelength; and
the second portion forms a second part of the length that is approximately ½ of the characteristic wavelength.

18. A fusor system comprising:
a cavity magnetron having a characteristic wavelength of emission;
a power source configured to supply electrical current to the cavity magnetron;
an antenna coupled to the cavity magnetron, the antenna having a length, approximately ¾ of the characteristic wavelength;
a waveguide disposed adjacent to the antenna and configured to reflect emissions from the antenna to generate a multipactor effect;
an enclosure that at least partially encloses the antenna and the waveguide to create a chamber; and
a fuel injection system configured to inject a fuel into the chamber and generate a fusion reaction in response to the multipactor effect.

19. The fusor system of claim 18, wherein the fuel comprises deuterium ions and protons.

20. The fusor system of claim 18, wherein the waveguide and a portion of the enclosure is configured to reflect neutrons.

* * * * *